(12) United States Patent
Kurokawa et al.

(10) Patent No.: US 11,832,522 B2
(45) Date of Patent: Nov. 28, 2023

(54) PIEZOELECTRIC TRANSDUCER

(71) Applicant: Murata Manufacturing Co., Ltd., Nagaokakyo (JP)

(72) Inventors: Fumiya Kurokawa, Nagaokakyo (JP); Shinsuke Ikeuchi, Nagaokakyo (JP); Yoichi Mochida, Nagaokakyo (JP); Seiji Umezawa, Nagaokakyo-shi (JP); Nobuyoshi Adachi, Nagaokakyo (JP); Yutaka Kishimoto, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 502 days.

(21) Appl. No.: 17/205,062

(22) Filed: Mar. 18, 2021

(65) Prior Publication Data
US 2021/0202824 A1    Jul. 1, 2021

Related U.S. Application Data

(63) Continuation of application No. PCT/JP2019/034707, filed on Sep. 4, 2019.

(30) Foreign Application Priority Data

Dec. 10, 2018  (JP) .................................. 2018-230898

(51) Int. Cl.
*H10N 30/20* (2023.01)
*H10N 30/88* (2023.01)
(Continued)

(52) U.S. Cl.
CPC ....... *H10N 30/2041* (2023.02); *H10N 30/304* (2023.02); *H10N 30/8542* (2023.02); *H10N 30/88* (2023.02); *H10N 30/04* (2023.02)

(58) Field of Classification Search
CPC .. H10N 30/88; H10N 30/8542; H10N 30/304; H10N 30/2041; H10N 30/04
See application file for complete search history.

(56) References Cited

U.S. PATENT DOCUMENTS 5,049,099 A     9/1991   Ito et al.
2008/0218031 A1  9/2008   Kuroda et al.
(Continued)

FOREIGN PATENT DOCUMENTS

DE   11 2016 002 558 T5   3/2018
JP           60-1097 A     1/1985
(Continued)

OTHER PUBLICATIONS

Official Communication issued in International Patent Application No. PCT/JP2019/032100, dated Sep. 10, 2019.
(Continued)

Primary Examiner — J. San Martin
(74) Attorney, Agent, or Firm — KEATING & BENNETT, LLP (57) ABSTRACT

A piezoelectric transducer includes beam portions each with a fixed end portion and extending in a direction away from the fixed end portion. A base portion is connected to the fixed end portion of each of the beam portions. The beam portions extends in a same plane, and respective extending directions of at least two beam portions are different from each other. The beam portions each include a single crystal piezoelectric layer having a polarization axis in a same direction, an upper electrode layer, and a lower electrode layer. A polarization axis has a polarization component in the plane. An axial direction of an orthogonal axis that is orthogonal to the polarization axis and extends in the above-described plane intersects with an extending direction of each of the plurality of beam portions.

18 Claims, 9 Drawing Sheets

(51) Int. Cl.
   *H10N 30/30*   (2023.01)
   *H10N 30/853*  (2023.01)
   *H10N 30/04*   (2023.01)

(56) References Cited

U.S. PATENT DOCUMENTS

| | | |
|---|---|---|
| 2010/0254547 A1 | 10/2010 | Grosh et al. |
| 2011/0296914 A1* | 12/2011 | Takahashi .......... G01C 19/5747 73/504.15 |
| 2012/0187804 A1 | 7/2012 | Gibbons et al. |
| 2012/0250909 A1 | 10/2012 | Grosh et al. |
| 2013/0264913 A1* | 10/2013 | Funakawa ............ H10N 30/883 310/365 |
| 2018/0108829 A1 | 4/2018 | Naono et al. |
| 2018/0192203 A1 | 7/2018 | Umeda et al. |
| 2020/0148532 A1* | 5/2020 | Grosh .................. H10N 30/308 |
| 2022/0045262 A1* | 2/2022 | Kishimoto ....... H10N 30/10516 |
| 2022/0248145 A1* | 8/2022 | Grosh .................. H10N 30/082 |
| 2022/0303693 A1* | 9/2022 | Ikeuchi ................ H10N 30/088 |
| 2023/0199405 A1* | 6/2023 | Umezawa .............. H04R 17/00 381/173 |

FOREIGN PATENT DOCUMENTS

| | | |
|---|---|---|
| JP | 02-126798 A | 5/1990 |
| JP | 2011-004129 A | 1/2011 |
| JP | 2014-515214 A | 6/2014 |
| JP | 5707323 B2 | 4/2015 |
| JP | 2018-098546 A | 6/2018 |
| WO | 2007/060768 A1 | 5/2007 |
| WO | 2017/094520 A1 | 6/2017 |

OTHER PUBLICATIONS

Official Communication issued in corresponding German Patent Application No. 112019006130.5, dated Aug. 12, 2021.

* cited by examiner

MAXIMUM VALUE: 19.643
MINIMUM VALUE: 0.000

PIEZOELECTRIC TRANSDUCER

CROSS REFERENCE TO RELATED APPLICATIONS

This application claims the benefit of priority to Japanese Patent Application No. 2018-230898 filed on Dec. 10, 2018 and is a Continuation Application of PCT Application No. PCT/JP2019/034707 filed on Sep. 4, 2019. The entire contents of each application are hereby incorporated herein by reference.

BACKGROUND OF THE INVENTION

1. Field of the Invention

The present invention relates to a piezoelectric transducer.

2. Description of the Related Art

Japanese Unexamined Patent Application Publication No. 2014-515214 discloses a configuration of a piezoelectric transducer. The piezoelectric transducer described in Japanese Unexamined Patent Application Publication No. 2014-515214 includes a substrate and a plurality of cantilevered beams. The cantilevered beams are adjacent to each other and tapered. Each of the plurality of cantilevered beams defines a beam base portion, a beam tip portion, and a beam body portion. The beam body portion is disposed between the beam base portion and the beam tip portion. Each of the plurality of cantilevered beams is disposed such that the beam tip portion extends toward a common imaginary point. Each of the plurality of cantilevered beams is coupled to the substrate along the beam base portion, and is free from the substrate along the beam body portion.

In each of a plurality of beam portions of a piezoelectric transducer, a single crystal piezoelectric layer which is a piezoelectric layer formed of a single crystal material is used in some cases. The single crystal piezoelectric layer has a polarization axis extending in one direction. When the polarization axis of the single crystal piezoelectric layer has a polarization component in only one direction in a plane in which each of the plurality of beam portions extends, the single crystal piezoelectric layer does not have a polarization component in a direction orthogonal to this polarization component direction in the above-described plane. When the plurality of beam portions include a beam portion extending in the polarization component direction and a beam portion extending in a direction intersecting with the polarization component direction, the difference among the respective bending elastic moduli of the plurality of beam portions increases. With this, for example, during driving of the piezoelectric transducer, due to the respective mechanical characteristics, such as the resonant frequencies, deformation amounts, and the like, of the plurality of beam portions being different from one another, the input/output characteristics of the piezoelectric transducer are deteriorated in some cases. That is, in the piezoelectric transducer in which the single crystal piezoelectric layer is used, due to the respective specific mechanical characteristics of the plurality of beam portions being different from one another, there is a case where a problem of device characteristics and the like arises.

SUMMARY OF THE INVENTION

Preferred embodiments of the present invention provide piezoelectric transducers that are each able to reduce a difference in mechanical characteristics among a plurality of beam portions including a single crystal piezoelectric layer.

A piezoelectric transducer according to a preferred embodiment of the present invention includes a plurality of beam portions and a base portion. Each of the plurality of beam portions includes a fixed end portion and extends in a direction away from the fixed end portion. The base portion is connected to the fixed end portion of each of the plurality of beam portions. The plurality of beam portions extend in the same or substantially the same plane, and respective extending directions of at least two beam portions of the plurality of beam portions are different from each other. The plurality of beam portions each include a single crystal piezoelectric layer having a polarization axis in a same or substantially same direction, an upper electrode layer, and a lower electrode layer. The upper electrode layer is provided on an upper side of the single crystal piezoelectric layer. The lower electrode layer faces at least a portion of the upper electrode layer with the single crystal piezoelectric layer interposed therebetween. The polarization axis has a polarization component in the plane. An axial direction of an orthogonal axis that is orthogonal or substantially orthogonal to the polarization axis and extends in the plane intersects with an extending direction of each of the plurality of beam portions.

According to preferred embodiments of the present invention, it is possible to reduce a difference in mechanical characteristics among a plurality of beam portions including a single crystal piezoelectric layer.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments of the present invention will be described below with reference to the accompanying drawings.

Hereinafter, piezoelectric transducers according to preferred embodiments of the present invention will be described with reference to the drawings. In the following description of the preferred embodiments, the same or corresponding elements in the drawings will be denoted by the same reference numerals, and description thereof will not be repeated.

Figure 1:
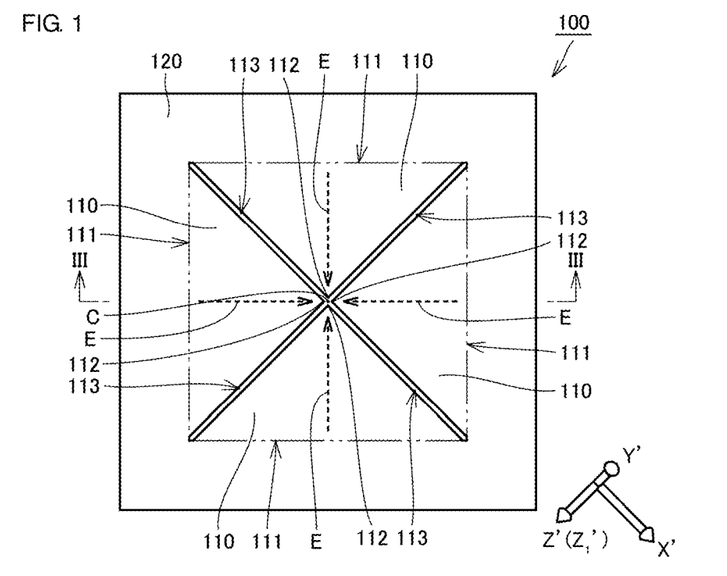
FIG. 1 is a plan view illustrating the configuration of a piezoelectric transducer according to a preferred embodiment of the present invention.
Figure 2:
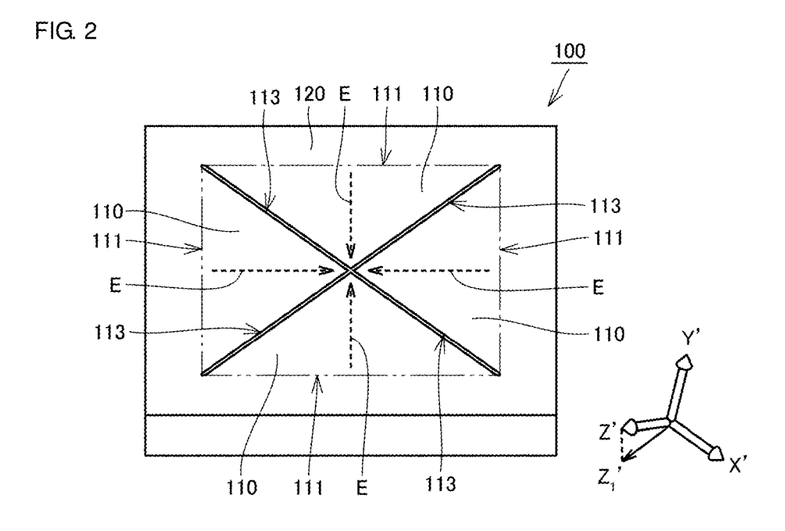
FIG. 2 is a perspective view illustrating the configuration of the piezoelectric transducer according to a preferred embodiment of the present invention when viewed from a front upper side.
Figure 3:
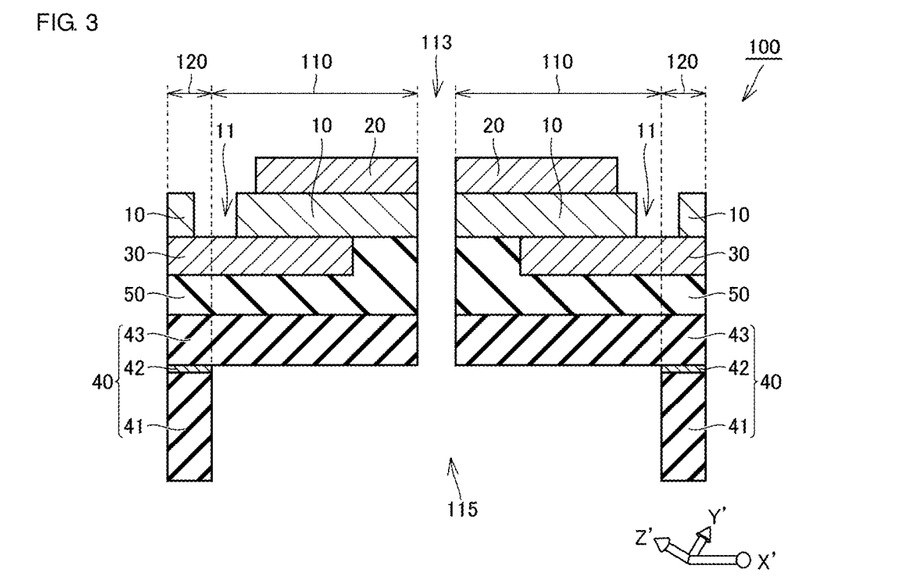
FIG. 3 is a sectional view of the piezoelectric transducer illustrated in FIG. 1 when viewed from the direction of arrows on a line III-III.

FIG. 1 is a plan view illustrating the configuration of the piezoelectric transducer according to a preferred embodiment of the present invention. FIG. 2 is a perspective view illustrating the configuration of the piezoelectric transducer according to a preferred embodiment of the present invention when viewed from a front upper side. FIG. 3 is a sectional view of the piezoelectric transducer illustrated in FIG. 1 when viewed from the direction of arrows on a line Note that in FIG. 1 and FIG. 2, boundaries of respective layers of the piezoelectric transducer are not illustrated.

As illustrated in FIG. 1 to FIG. 3, a piezoelectric transducer 100 according to the present preferred embodiment of the present invention includes a plurality of beam portions 110 and a base portion 120.

As illustrated in FIG. 1, each of the plurality of beam portions 110 includes a fixed end portion 111 and a tip end portion 112. Each of the plurality of beam portions 110 extends in a direction away from the fixed end portion 111. The tip end portion 112 is located at the tip end in an extending direction E from the fixed end portion 111 in each of the plurality of beam portions 110. Each of the plurality of beam portions 110 extends in the same or substantially the same plane.

Each of the plurality of beam portions 110 has an outer shape that is tapered in the extending direction E when viewed from a direction perpendicular or substantially perpendicular to the above-described plane. Specifically, each of the plurality of beam portions 110 preferably has a triangular outer shape when viewed from the direction perpendicular or substantially perpendicular to the above-described plane. In the present preferred embodiment, this triangular shape is an isosceles triangular shape with the fixed end portion 111 as the base and the tip end portion 112 as the apex. That is, the extending direction E of each of the plurality of beam portions 110 is a direction connecting the midpoint of the base and the apex of the isosceles triangular shape that is the outer shape of each beam portion 110.

Note that when viewed from the direction perpendicular or substantially perpendicular to the above-described plane, each of the plurality of beam portions 110 may have an outer shape having a constant or substantially constant width in the extending direction E, or may have an outer shape in which the width gradually increases in the extending direction E. Each of the plurality of beam portions 110 may have a quadrilateral outer shape. Piezoelectric transducers according to modifications which have different shapes and arrangements of the beam portions 110 will be described later.

As illustrated in FIG. 1 and FIG. 2, in the present preferred embodiment, the piezoelectric transducer 100 includes four beam portions 110. As described above, the piezoelectric transducer 100 according to the present preferred embodiment preferably includes three or more beam portions 110, for example.

As illustrated in FIG. 1, each of the plurality of beam portions 110 is mutually point-symmetrically arranged with respect to a virtual center point C of the piezoelectric transducer 100 when viewed from the direction perpendicular or substantially perpendicular to the above-described plane. In the present preferred embodiment, the four beam portions 110 are arranged such that, when viewed from the direction perpendicular to the above-described plane, the respective extending directions E of the beam portions 110 which are adjacent while extending in different directions from one another in the above-described plane are different by about 90° from each other.

In this way, the respective extending directions E of at least two beam portions 110 among the plurality of beam portions 110 are different from each other. Note that the beam portions 110 having the same extending direction E may be included in the plurality of beam portions 110.

In the present preferred embodiment, the respective extending directions E of the plurality of beam portions 110 extend toward the virtual center point C when viewed from the direction perpendicular or substantially perpendicular to the above-described plane. Note that the extending direction E of each of the plurality of beam portions 110 may extend away from the virtual center point. Piezoelectric transducers according to modifications each including a plurality of beam portions in which the extending directions E are different from those in the present preferred embodiment will be described later.

As illustrated in FIG. 1 and FIG. 2, each of the plurality of beam portions 110 is spaced apart from one another with gaps 113 interposed therebetween. In the present preferred embodiment, the gaps 113 located between the plurality of beam portions 110 extend radially from the virtual center point C when viewed from the direction perpendicular or substantially perpendicular to the above-described plane. In the direction in which the gap 113 extends, the width of the gap 113 is constant or substantially constant.

That is, when viewed from the direction perpendicular or substantially perpendicular to the above-described plane, each of the plurality of beam portions 110 is arranged such that the spaces between the beam portions 110 which are adjacent while extending in different directions from one another in the above-described plane are equal or substantially equal to one another.

As illustrated in FIG. 1 to FIG. 3, in the present preferred embodiment, the base portion 120 is connected to the fixed end portion 111 of each of the plurality of beam portions 110. The tip end portion 112 of each of the plurality of beam portions 110 is a free end spaced apart from the base portion 120.

Note that the tip end portion 112 of each of the plurality of beam portions 110 may be connected to a plate-shaped portion that vibrates up and down during driving the piezoelectric transducer 100. Piezoelectric transducers according to modifications each including a plate-shaped portion will be described later.

As illustrated in FIG. 3, below the plurality of beam portions 110 and the gaps 113 located between the respective beam portions 110, a recessed portion 115 that is opened downward is provided. In the piezoelectric transducer 100 according to the present preferred embodiment, a portion located above the recessed portion 115 defines and functions as the plurality of beam portions 110 and the gaps 113 located between the beam portions 110.

As illustrated in FIG. 3, the piezoelectric transducer according to the present preferred embodiment includes a single crystal piezoelectric layer 10, an upper electrode layer 20, and a lower electrode layer 30. In the present preferred embodiment, each of the plurality of beam portions 110 includes the single crystal piezoelectric layer 10, the upper electrode layer 20, and the lower electrode layer 30.

The single crystal piezoelectric layer 10 is provided with a hole portion 11. The hole portion 11 penetrates the single crystal piezoelectric layer 10 in an up and down direction. In the present preferred embodiment, the hole portion 11 is located above the lower electrode layer 30. Note that in FIG. 1 and FIG. 2, the hole portion 11 is not illustrated.

In the present preferred embodiment, the single crystal piezoelectric layer 10 defines a portion of the beam portion 110 and a portion of the base portion 120. The material of the single crystal piezoelectric layer 10 will be described later.

The upper electrode layer 20 is arranged on an upper side of the single crystal piezoelectric layer 10. The upper electrode layer 20 is arranged such that at least a portion thereof is located above the recessed portion 115.

In the present preferred embodiment, the upper electrode layer 20 defines a portion of the beam portion 110. The upper electrode layer 20 is preferably made of a conductive material, such as Pt or the like, for example. A close contact layer preferably made of Ti or the like, for example, may be provided between the upper electrode layer 20 and the single crystal piezoelectric layer 10.

The lower electrode layer 30 faces at least a portion of the upper electrode layer 20 with the single crystal piezoelectric layer 10 interposed therebetween. The lower electrode layer 30 is arranged such that at least a portion of the lower electrode layer 30 is located above the recessed portion 115. The lower electrode layer 30 faces at least a portion of the upper electrode layer 20 with the single crystal piezoelectric layer 10 interposed therebetween, above the recessed portion 115.

In the present preferred embodiment, the lower electrode layer 30 defines a portion of the beam portion 110 and a portion of the base portion 120. Furthermore, an end portion of the lower electrode layer 30 on the gap 113 side is not exposed to the gap 113 in the present preferred embodiment, but may be exposed to the gap 113.

The lower electrode layer 30 is preferably made of a conductive material, such as Pt or the like, for example. A close contact layer preferably made of Ti or the like, for example, may be provided between the lower electrode layer 30 and the single crystal piezoelectric layer 10.

The piezoelectric transducer according to the present preferred embodiment further includes a substrate 40. The substrate 40 is below the lower electrode layer 30. The substrate 40 includes a handle layer 41, a BOX layer 42 laminated on an upper portion of the handle layer 41, and an active layer 43 laminated on an upper portion of the BOX layer 42.

In the present preferred embodiment, each of the handle layer 41 and the active layer 43 is preferably made of Si, for example. The BOX layer 42 is preferably made of $SiO_2$, for example. In the present preferred embodiment, the substrate 40 is preferably a silicon on insulator (SOI) substrate, for example.

In the present preferred embodiment, the recessed portion 115 is provided in the handle layer 41 and the BOX layer 42. The gap 113 is provided in the active layer 43. That is, the handle layer 41 and the BOX layer 42 define a portion of the base portion 120. The active layer 43 defines a portion of the beam portion 110 and a portion of the base portion 120.

An intermediate layer 50 is between the substrate 40 and the lower electrode layer 30 and between the substrate 40 and the single crystal piezoelectric layer 10. The intermediate layer 50 covers, from below, a lower surface of the lower electrode layer and a portion of a lower surface of the single crystal piezoelectric layer 10 where the lower electrode layer 30 is not located. The intermediate layer 50 is preferably, for example, made of $SiO_2$.

In the present preferred embodiment, by applying a potential difference between the upper electrode layer 20 and the lower electrode layer 30, a portion of the single crystal piezoelectric layer 10 that is located between the upper electrode layer 20 and the lower electrode layer 30 can be distorted. Accordingly, the piezoelectric transducer 100 vibrates such that the plurality of beam portions 110 bends up and down when being driven. Note that the piezoelectric transducer 100 according to the present preferred embodiment may be used as a receiving element.

Next, a non-limiting example of a method for manufacturing the piezoelectric transducer 100 according to the present preferred embodiment of the present invention will be described.

Figure 4:
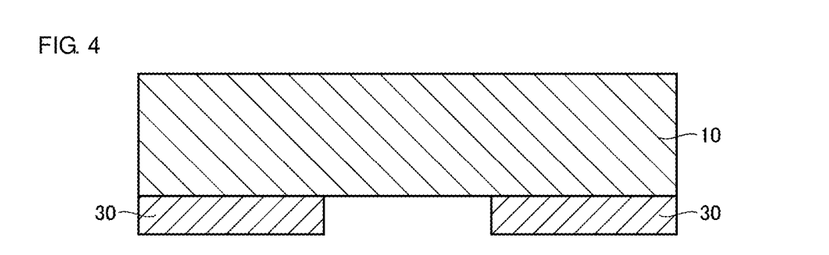
FIG. 4 is a sectional view illustrating a state in which a lower electrode layer is provided on a lower surface of a single crystal piezoelectric layer in a method for manufacturing the piezoelectric transducer according to a preferred embodiment of the present invention.

FIG. 4 is a sectional view illustrating a state in which the lower electrode layer is provided on the lower surface of the single crystal piezoelectric layer in the method for manufacturing the piezoelectric transducer according to the present preferred embodiment of the present invention. As illustrated in FIG. 4, the lower electrode layer 30 is provided on the lower surface of the single crystal piezoelectric layer 10 by a lift-off method, a plating method, an etching method, or the like, for example.

Figure 5:
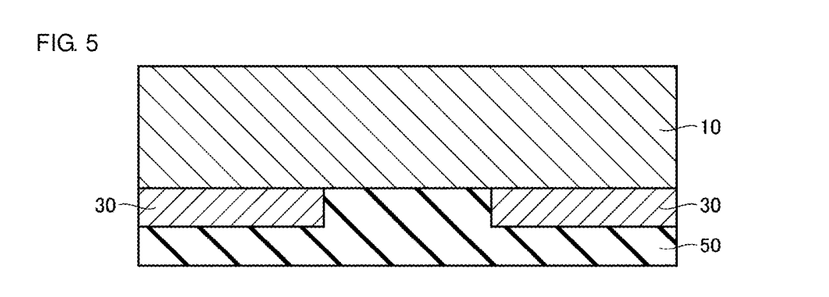
FIG. 5 is a sectional view illustrating a state in which an intermediate layer is provided on respective lower surfaces of the lower electrode layer and the single crystal piezoelectric layer in the method for manufacturing the piezoelectric transducer according to a preferred embodiment of the present invention.

FIG. 5 is a sectional view illustrating a state in which the intermediate layer is provided on the respective lower surfaces of the lower electrode layer and the single crystal piezoelectric layer in the method for manufacturing the piezoelectric transducer according to the present preferred embodiment of the present invention. As illustrated in FIG. 5, the intermediate layer 50 is provided on the respective lower surfaces of the lower electrode layer 30 and the single crystal piezoelectric layer 10 by a chemical vapor deposition (CVD) method, a physical vapor deposition (PVD) method, or the like, for example.

Figure 6:
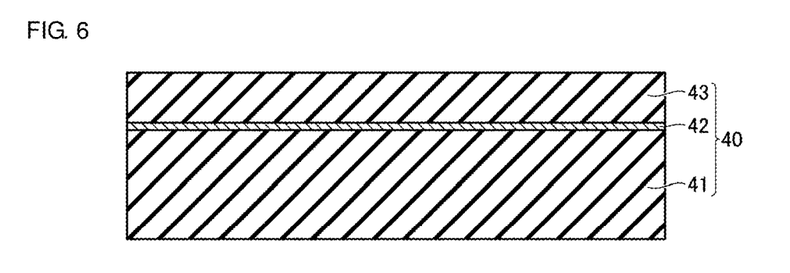
FIG. 6 is a sectional view illustrating a prepared substrate in the method for manufacturing the piezoelectric transducer according to a preferred embodiment of the present invention.

FIG. 6 is a sectional view illustrating a prepared substrate in the method for manufacturing the piezoelectric transducer according to the present preferred embodiment of the present invention. As illustrated in FIG. 6, the substrate 40 in a state in which the recessed portion 115 is not formed is prepared.

Figure 7:
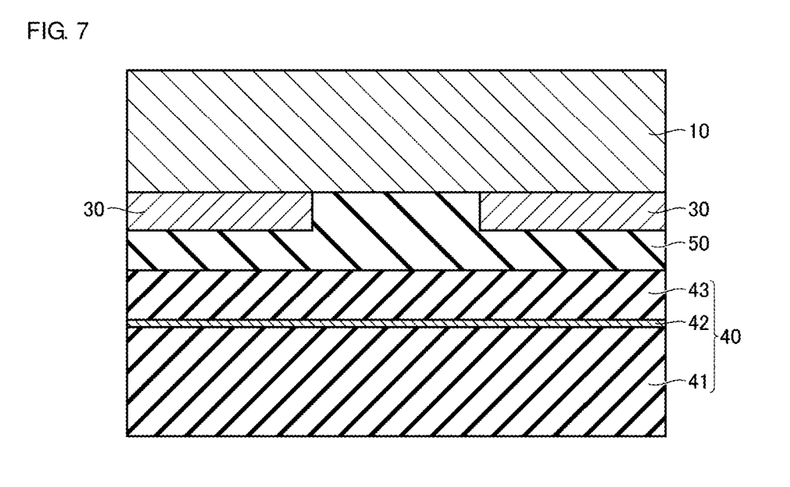
FIG. 7 is a sectional view illustrating a state in which the plurality of layers illustrated in FIG. 5 has been bonded to the substrate illustrated in FIG. 6 in the method for manufacturing the piezoelectric transducer according to a preferred embodiment of the present invention.

FIG. 7 is a sectional view illustrating a state in which the plurality of layers illustrated in FIG. 5 has been bonded to the substrate illustrated in FIG. 6 in the method for manufacturing the piezoelectric transducer according to the present preferred embodiment of the present invention. As illustrated in FIG. 7, a main surface of the substrate 40 on the active layer 43 side is bonded to a lower surface of the intermediate layer 50.

Figure 8:
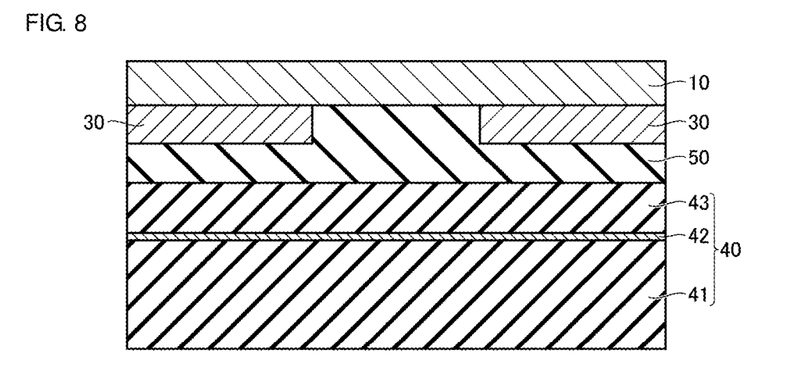
FIG. 8 is a sectional view illustrating a state in which an upper surface of the single crystal piezoelectric layer is scraped in the method for manufacturing the piezoelectric transducer according to a preferred embodiment of the present invention.

FIG. 8 is a diagram illustrating a state in which an upper surface of the single crystal piezoelectric layer is scraped in the method for manufacturing the piezoelectric transducer according to the present preferred embodiment of the present invention. As illustrated in FIG. 8, the upper surface of the single crystal piezoelectric layer 10 is scraped by chemical mechanical polishing (CMP) or the like, for example, and the single crystal piezoelectric layer 10 is made to have a desired thickness.

Figure 9:
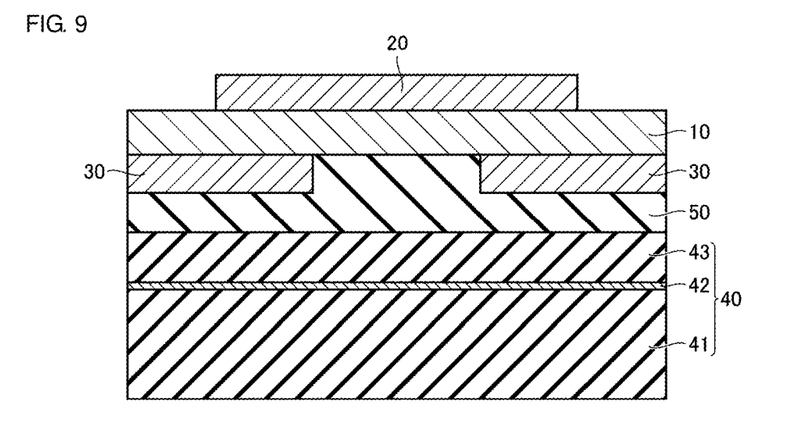
FIG. 9 is a sectional view illustrating a state in which an upper electrode layer is provided on the upper surface of the single crystal piezoelectric layer in the method for manufacturing the piezoelectric transducer according to a preferred embodiment of the present invention.

FIG. 9 is a sectional view illustrating a state in which the upper electrode layer is provided on the upper surface of the single crystal piezoelectric layer in the method for manufacturing the piezoelectric transducer according to the present preferred embodiment of the present invention. As illustrated in FIG. 9, the upper electrode layer 20 is provided on a portion of the upper surface of the single crystal piezoelectric layer 10 by the lift-off method, the plating method, the etching method, or the like, for example.

Figure 10:
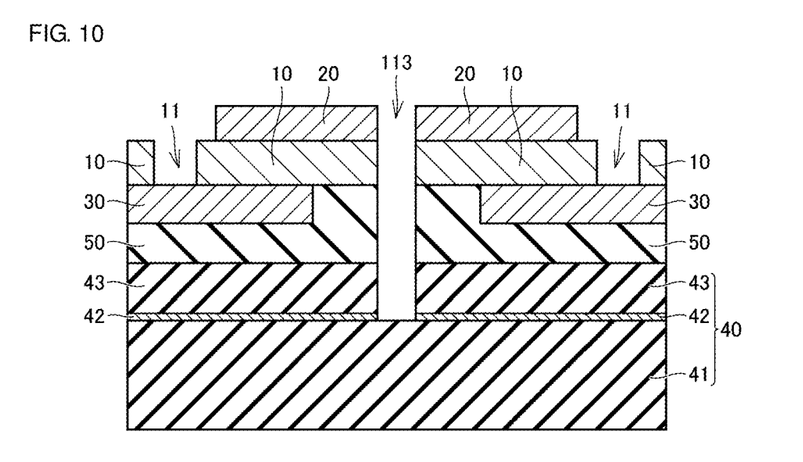
FIG. 10 is a sectional view illustrating a state in which a hole portion at the single crystal piezoelectric layer and a gap portion between a plurality of beam portions are formed in the method for manufacturing the piezoelectric transducer according to a preferred embodiment of the present invention.

FIG. 10 is a sectional view illustrating a state in which the hole portion at the single crystal piezoelectric layer and the gap portion between the plurality of beam portions are formed in the method for manufacturing the piezoelectric transducer according to the present preferred embodiment of the present invention. As illustrated in FIG. 10, the hole portion 11 is provided in the single crystal piezoelectric layer 10 by the lift-off method, the plating method, the etching method, or the like, for example. Furthermore, by the lift-off method, the plating method, the etching method, or the like, for example, the single crystal piezoelectric layer 10, the upper electrode layer 20, the intermediate layer 50, the active layer 43, and the BOX layer 42 are provided with the gap 113 located between the plurality of beam portions 110.

Finally, by performing deep reactive ion etching (deep RIE) or the like, for example, on the substrate 40 from a main surface on the lower side of the substrate 40, the recessed portion 115 is formed in the substrate 40.

Through the above-described processes, the piezoelectric transducer 100 according to the present preferred embodiment of the present invention as illustrated in FIG. 3 is manufactured.

Next, a material of which the single crystal piezoelectric layer 10 is formed will be described.

The single crystal piezoelectric layer 10 is preferably made of lithium niobate ($LiNbO_3$) or lithium tantalate ($LiTaO_3$), for example. Lithium niobate and lithium tantalate are each a ceramic material having a relatively high piezoelectricity.

Each crystal structure of lithium niobate and lithium tantalate belongs to a trigonal system. The trigonal system is a crystal system having a three-fold rotational symmetry with respect to a main axis. Respective polarization axes of lithium niobate and lithium tantalate extend so as to respectively be along the axial directions of the main axes of the trigonal systems in the respective crystal structures. In the single crystal piezoelectric body, only the axial direction of the polarization axis is largely different in an elastic modulus from the other directions.

As illustrated in FIG. 1 to FIG. 3, the single crystal piezoelectric layer 10 has a polarization axis Z' oriented in one direction. The polarization axis Z' has a polarization component in the same plane or substantially the same plane in which each of the plurality of beam portions 110 extends. In the present preferred embodiment, the polarization axis Z' intersects with the plane, while being tilted relative thereto, where each of the plurality of beam portions 110 extends. However, the polarization axis Z' may extend only in the above-described plane.

Lithium niobate and lithium tantalate used as the material of the single crystal piezoelectric layer 10 are each subjected to X-cut or Y-cut such that the polarization axis Z' has a polarization component extending in the above-described plane direction.

When lithium niobate and lithium tantalate are each subjected to X-cut, the polarization axis Z' extends only in the above-described plane. That is, the angle between the polarization axis Z' and the above-described plane is always approximately 0°.

When lithium niobate and lithium tantalate are each subjected to Y-cut, since the angle between the polarization axis Z' and the above-described plane changes depending on a cut-angle which is the cut-out angle of the crystal, the piezoelectricity of the piezoelectric transducer 100 largely changes. From the viewpoint of the piezoelectricity, the cut-angle of Y-cut is preferably equal to or greater than about 20° and equal to or smaller than about 35°, and is more preferably about 26°, for example. In the present preferred embodiment, the single crystal piezoelectric layer 10 is made of lithium niobate, which is subjected to Y-cut at a cut-angle of 30°.

As described above, in the present preferred embodiment, the single crystal piezoelectric layer 10 has the polarization axis Z' that is oriented to one direction and has the polarization component in the above-described plane. That is, the polarization axes Z' of the single crystal piezoelectric layers 10 respectively included in the plurality of beam portions 110 are all oriented in the same direction.

As illustrated in FIG. 1, the axial direction of the polarization axis Z' has the component only in one direction in the plane in which each of the plurality of beam portions 110 extends. From the viewpoint of a piezoelectric constant and an elastic modulus of the single crystal piezoelectric layer 10, in the piezoelectric transducer 100 having the polarization component in the above-described plane, electrical-mechanical conversion efficiency is improved.

As illustrated in FIG. 1 to FIG. 3, in the plane in which each of the plurality of beam portions 110 extends, the single crystal piezoelectric layer 10 has an orthogonal axis X' orthogonal or substantially orthogonal to the polarization component included in the polarization axis Z' in the above-described plane. That is, as illustrated in FIG. 1 to FIG. 3, the axial direction of the orthogonal axis X' is orthogonal or substantially orthogonal to the polarization axis Z' and extends in the above-described plane. The polarization axis Z' of the single crystal piezoelectric layer 10 has no component in the axial direction of the orthogonal axis X'. The single crystal piezoelectric layer 10 further has a third axis Y' orthogonal or substantially orthogonal to each of the polarization axis Z' and the orthogonal axis X'.

In the single crystal piezoelectric layer 10, the bending elastic moduli of the single crystal piezoelectric layer are significantly different between a direction $Z_1$' of the polarization component included in the polarization axis Z' in the above-described plane and the axial direction of the orthogonal axis X'. Specifically, the bending elastic modulus of the single crystal piezoelectric layer 10 in the polarization component direction $Z_1$' included in the polarization axis Z' in the above-described plane is relatively small, and the bending elastic modulus of the single crystal piezoelectric layer 10 in the axial direction of the orthogonal axis X' is relatively large. Accordingly, in the present preferred embodiment, the piezoelectric transducer 100 is configured such that the plurality of beam portions 110 does not include a beam portion extending in the polarization component direction $Z_1$' and a beam portion extending in the axial direction of the orthogonal axis X'.

Here, a piezoelectric transducer according to a comparative example in which both a beam portion extending in the polarization component direction and a beam portion extending in the axial direction of the orthogonal axis X' are included in a plurality of beam portions will be described.

Figure 11:
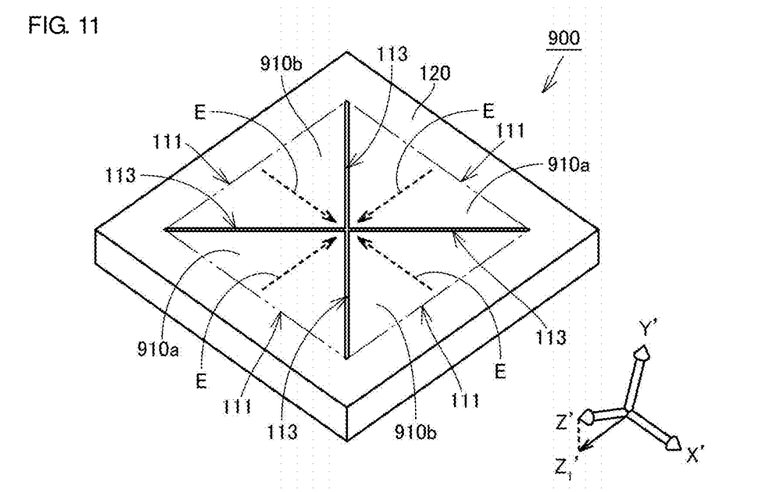
FIG. 11 is a perspective view illustrating the configuration of a piezoelectric transducer according to a comparative example.

FIG. 11 is a perspective view illustrating the configuration of the piezoelectric transducer according to the comparative example. As illustrated in FIG. 11, a piezoelectric transducer 900 according to the comparative example has the same or substantially the same configuration as that of the piezoelectric transducer 100 according to the present preferred embodiment, except that an angular relationship between the polarization component direction and the axial direction of the orthogonal axis X' in the single crystal piezoelectric layer and the extending direction of each of the plurality of beam portions is different from the above-described angular relationship in the piezoelectric transducer 100 according to the present preferred embodiment.

The piezoelectric transducer 900 according to the comparative example includes two beam portions 910a extending in the polarization component direction and two beam portions 910b extending in the axial direction of the orthogonal axis X'. For this reason, in the piezoelectric transducer 900 according to the comparative example, the bending elastic moduli are significantly different between each of the two beam portions 910a extending in the polarization component direction and each of the two beam portions 910b extending in the direction intersecting with the polarization component direction.

Figure 12:
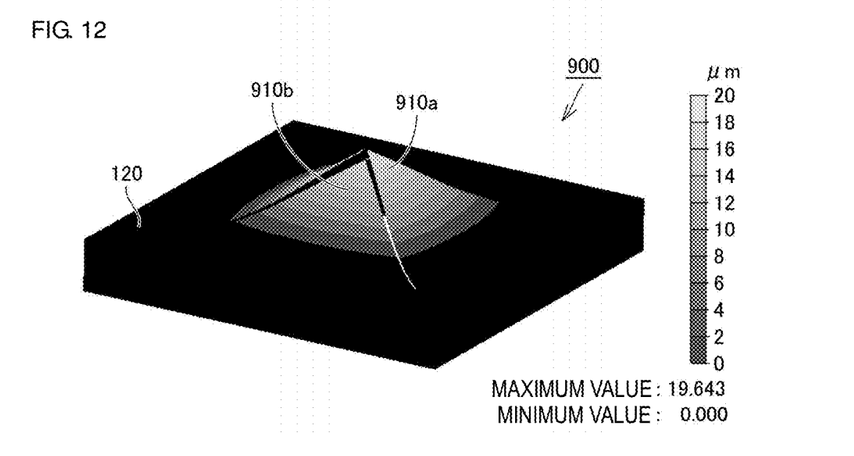
FIG. 12 is a perspective view illustrating a state in which each of a plurality of beam portions has been displaced uppermost during driving the piezoelectric transducer according to the comparative example.

FIG. 12 is a perspective view illustrating a state in which each of the plurality of beam portions has been displaced uppermost during driving the piezoelectric transducer according to the comparative example. As illustrated in FIG. 12, during driving of the piezoelectric transducer 900 according to the comparative example, the maximum displacements in the up-down direction are significantly different between each of the two beam portions 910a extending in the polarization component direction and each of the two beam portions 910b extending in the axial direction of the orthogonal axis X'. Accordingly, the gap between the beam portion 910a and the beam portion 910b which are adjacent while extending in directions different from each other in the above-described plane is widened during driving.

On the other hand, as illustrated in FIG. 1 and FIG. 2, in the piezoelectric transducer 100 according to the present preferred embodiment, each of the polarization component direction $Z_1$' and the axial direction of the orthogonal axis X' intersects with the extending direction E of each of the plurality of beam portions 110. That is, the plurality of beam portions 110 do not include a beam portion extending in the polarization component direction $Z_1$' and a beam portion extending in the axial direction of the orthogonal axis X'.

Specifically, the angle between the extending direction E of each of the plurality of beam portions 110 and the axial direction of the orthogonal axis X' is preferably equal to or greater than about 40 degrees and equal to or smaller than about 50 degrees, for example. With this configuration, the respective bending elastic moduli of the plurality of beam portions 110 including the single crystal piezoelectric layer 10 are uniform or substantially uniform. More preferably, in the piezoelectric transducer 100, the angle between the extending direction E of each of the plurality of beam portions 110 and the axial direction of the orthogonal axis X' is about 45 degrees, for example. In this case, the respective bending elastic moduli of the plurality of beam portions 110 are more uniform.

Figure 13:
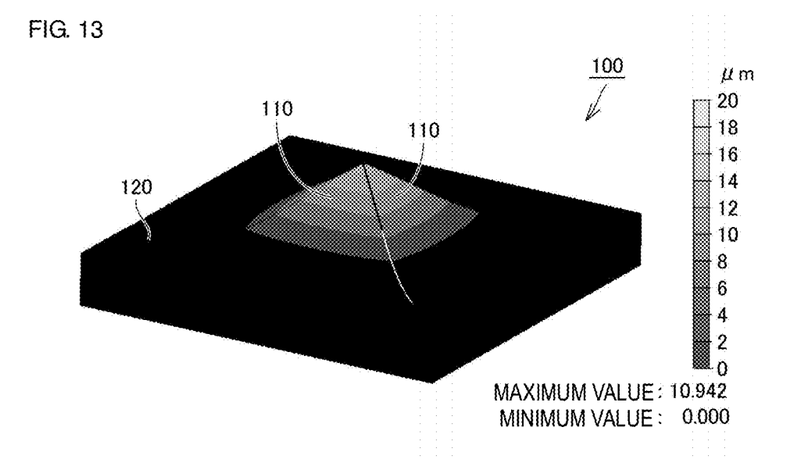
FIG. 13 is a perspective view illustrating a state in which each of the plurality of beam portions has been displaced uppermost during driving the piezoelectric transducer according to a preferred embodiment of the present invention.

FIG. 13 is a perspective view illustrating a state in which each of the plurality of beam portions has been displaced uppermost during driving the piezoelectric transducer according to the present preferred embodiment of the present invention. As illustrated in FIG. 13, in the piezoelectric transducer 100 according to the present preferred embodiment, since the respective bending elastic moduli of the plurality of beam portions 110 are uniform or substantially uniform, the plurality of beam portions 110 are uniformly or substantially uniformly displaced in the up-down direction during driving. Accordingly, the difference among deformation amounts of the plurality of beam portions 110 of the piezoelectric transducer 100 according to the present preferred embodiment is smaller than the difference among deformation amounts of the plurality of beam portions 910a and 910b of the piezoelectric transducer 900 according to the comparative example.

Accordingly, the gap between the beam portions 110 which are adjacent while extending in directions different from each other in the above-described plane is narrower during driving than the gap between the beam portion 910a and the beam portion 910b according to the comparative example.

As described above, in the piezoelectric transducer 100 according to the present preferred embodiment, the single crystal piezoelectric layer 10 has the polarization axis Z' oriented in one direction. The polarization axis Z' has the polarization component in the above-described plane. The axial direction of the orthogonal axis X' that is orthogonal or substantially orthogonal to the polarization axis Z' and extends in the above-described plane intersects with the extending direction E of each of the plurality of beam portions 110.

According to the configuration described above, it is possible to prevent the beam portion extending in the polarization component direction $Z_1'$ and the beam portion extending in the axial direction of the orthogonal axis X' from being included in the plurality of beam portions 110, and it is thus possible to reduce the difference in mechanical characteristics among the plurality of beam portions 110. Furthermore, in the present preferred embodiment of the present invention, specifically, the respective bending elastic moduli of the plurality of beam portions can be uniform or substantially uniform. As a result, during driving the piezoelectric transducer 100 according to the present preferred embodiment, since the difference in mechanical characteristics, such as the resonant frequencies, the deformation amounts, and the like, for example, of the plurality of beam portions 110 can be reduced, input/output characteristics of the piezoelectric transducer 100 can be improved.

In the piezoelectric transducer 100 according to the present preferred embodiment, the angle between the extending direction E of each of the plurality of beam portions 110 and the axial direction of the orthogonal axis X' is preferably equal to or greater than about 40 degrees and equal to or smaller than about 50 degrees, for example.

With the above-described configuration, since each of the angles between the extending direction E of each of the plurality of beam portions 110 and the direction intersecting with the polarization component direction $Z_1'$ in the above-described plane are preferably equal to or greater than about 40 degrees and equal to or smaller than about 50 degrees in all the beam portions 110, the respective bending elastic moduli of the plurality of beam portions 110 can be made more uniform. As a result, during driving of the piezoelectric transducer 100, since the difference in mechanical characteristics, such as the resonant frequencies, the deformation amounts, and the like, for example, of the plurality of beam portions 110 can be further reduced, the input/output characteristics of the piezoelectric transducer 100 can be efficiently improved.

In the piezoelectric transducer 100 according to the present preferred embodiment, the single crystal piezoelectric layer 10 is preferably made of lithium niobate or lithium tantalate, for example.

Each crystal structure of lithium niobate and lithium tantalate belongs to the trigonal system. Since respective polarization axes of lithium niobate and lithium tantalate extend so as to respectively be along the axial directions of the main axes of the trigonal systems in the respective crystal structures, the polarization axes are each extremely longer than those of the other piezoelectric ceramic materials. Furthermore, the trigonal system is a crystal system having a three-fold rotational symmetry with respect to the main axis.

In the case where the polarization axis intersects with the plane, while being tilted relative thereto, where each of the plurality of beam portions extends, in the above-described plane, the bending elastic moduli of the single crystal piezoelectric layer 10 are significantly different between the polarization component direction $Z_1'$ and the axial direction of the orthogonal axis X'.

However, even in the case where the single crystal piezoelectric layer 10 is made of lithium niobate or lithium tantalate, by the extending direction E of each of the plurality of beam portions 110 and the axial direction of the orthogonal axis X' satisfying the above-described relationship, the respective bending elastic moduli of the plurality of beam portions 110 can be made uniform while making the single crystal piezoelectric layer 10 with a material having high piezoelectricity. As a result, it is possible to improve the input/output characteristics of the piezoelectric transducer.

In the piezoelectric transducer 100 according to the present preferred embodiment, the polarization axis Z' may extend only in the above-described plane.

In the above-described configuration, lithium niobate subjected to the X-cut or lithium tantalate subjected to the X-cut, for example, is preferably used as the material of the single crystal piezoelectric layer 10, in this case, the angle between the polarization axis Z' and the above-described plane is always approximately 0°. With this configuration, it is possible to reduce or prevent the occurrence of change in the piezoelectricity of the piezoelectric transducer 100 due to the difference in cut-angles of the X-cut.

In the piezoelectric transducer 100 according to the present preferred embodiment, when viewed from the direction perpendicular or substantially perpendicular to the above-described plane, the plurality of beam portions 110 each have a triangular or quadrilateral outer shape and such that the spaces between the beam portions 110 which are adjacent while extending in different directions from each other in the above-described plane are equal or substantially equal to one another.

In the above-described configuration, by the respective bending elastic moduli of the plurality of beam portions 110 being uniform or substantially uniform, the change amounts of the gaps 113 due to the displacements in the plurality of beam portions 110 during driving can be made uniform, and the input/output characteristics of the piezoelectric transducer 100 can be improved.

Hereinafter, a piezoelectric transducer according to each modification of the present preferred embodiment will be described with reference to the drawings. Note that description of the same configuration as that of the piezoelectric transducer 100 according to the one preferred embodiment of the present invention will not be repeated.

Figure 14:
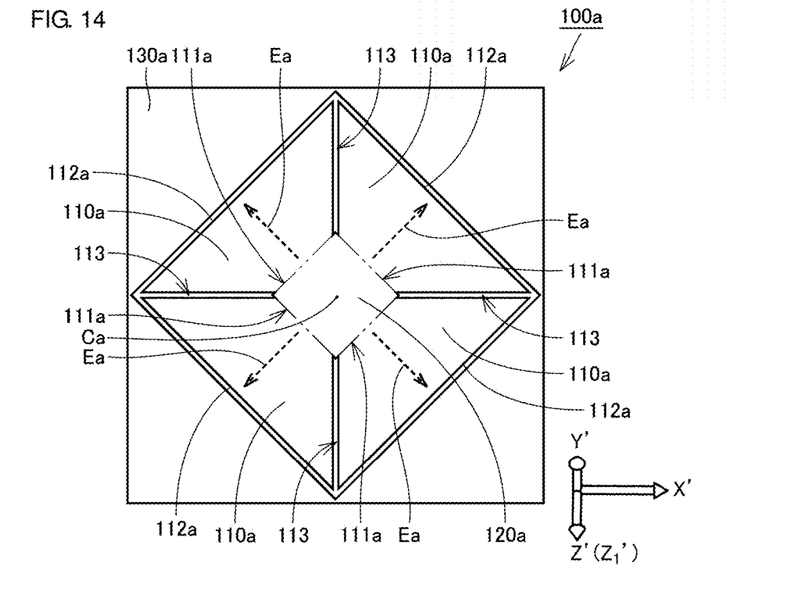
FIG. 14 is a plan view illustrating the configuration of a piezoelectric transducer according to a first modification of a preferred embodiment of the present invention.

FIG. 14 is a plan view illustrating the configuration of a piezoelectric transducer according to a first modification of the present preferred embodiment of the present invention. As illustrated in FIG. 14, a piezoelectric transducer 100a according to the first modification of the present preferred embodiment of the present invention includes a plurality of beam portions 110a and a base portion 120a.

The plurality of beam portions 110a extend in the same or substantially the same plane, and each has an outer shape the width of which gradually increases in an extending direction Ea when viewed from the direction perpendicular or substantially perpendicular to this plane. Specifically, each of the plurality of beam portions 110a has a trapezoidal outer shape with a fixed end portion 111a as the upper base when viewed from the direction perpendicular or substantially perpendicular to the above-described plane.

The extending direction Ea of each of the plurality of beam portions 110a extends away from a virtual center point Ca of the piezoelectric transducer 100a when viewed from the direction perpendicular or substantially perpendicular to the above-described plane.

The piezoelectric transducer 100a according to the first modification of the present preferred embodiment further includes a peripheral wall portion 130a surrounding the plurality of beam portions 110a when viewed from the direction perpendicular or substantially perpendicular to the above-described plane. A tip end portion 112a of each of the plurality of beam portions 110a and the peripheral wall portion 130a are spaced apart from each other.

The base portion 120a and the peripheral wall portion 130a are directly or indirectly connected to each other at a lower side in the lamination direction of the plurality of beam portions 110a.

In the piezoelectric transducer 100a according to the first modification of the present preferred embodiment, the axial direction of the orthogonal axis X' intersects with the extending direction Ea of each of the plurality of beam portions 110a.

Figure 15:
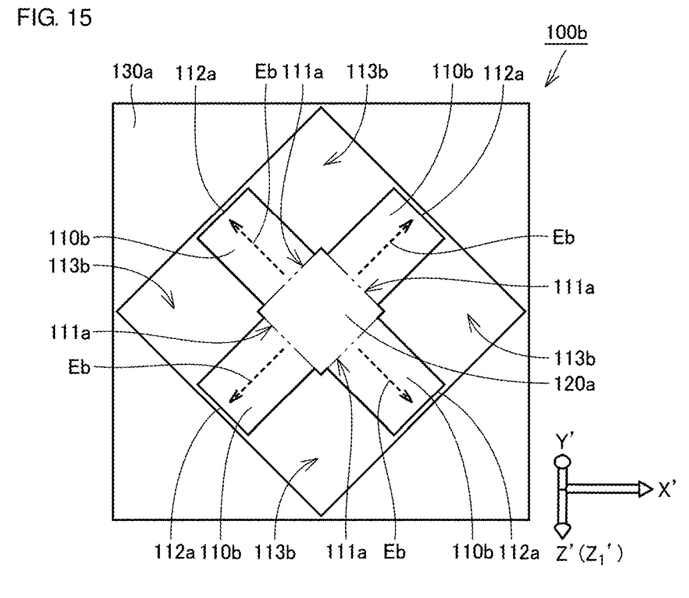
FIG. 15 is a plan view illustrating the configuration of a piezoelectric transducer according to a second modification of a preferred embodiment of the present invention.

FIG. 15 is a plan view illustrating the configuration of a piezoelectric transducer according to a second modification of the present preferred embodiment of the present invention. As illustrated in FIG. 15, a piezoelectric transducer 100b according to the second modification of the present preferred embodiment of the present invention is different from the piezoelectric transducer 100a according to the first modification of the present preferred embodiment only in a shape of each of the plurality of beam portions.

In the piezoelectric transducer 100b according to the second modification of the present preferred embodiment, a plurality of beam portions 110b extends in the same or substantially the same plane. Each of the plurality of beam portions 110b has an outer shape having a constant or substantially constant width in an extending direction Eb when viewed from the direction perpendicular to the above-described plane. Specifically, each of the plurality of beam portions 110b has a rectangular outer shape when viewed from the direction perpendicular to the above-described plane.

In the piezoelectric transducer 100b according to the second modification of the present preferred embodiment, a gap 113b located between the plurality of beam portions 110b has a square or substantially square shape when viewed from the direction perpendicular or substantially perpendicular to the above-described plane.

In the piezoelectric transducer 100b according to the second modification of the present preferred embodiment, the axial direction of the orthogonal axis X' intersects with the extending direction Eb of each of the plurality of beam portions 110b.

Figure 16:
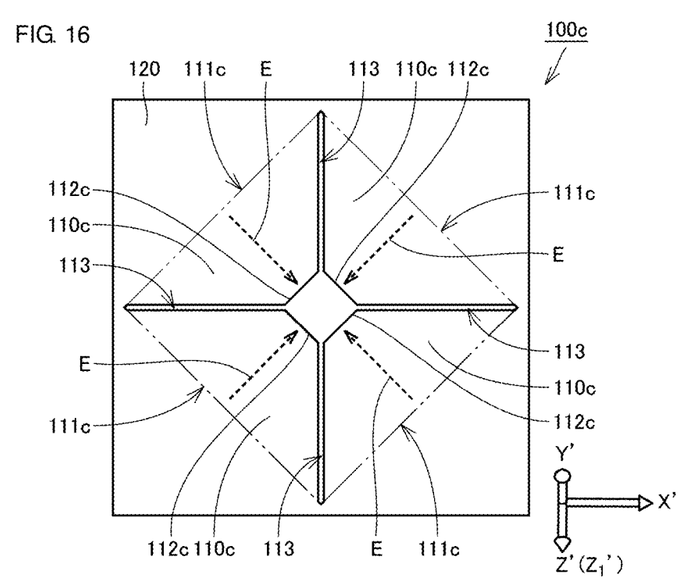
FIG. 16 is a plan view illustrating the configuration of a piezoelectric transducer according to a third modification of a preferred embodiment of the present invention.

FIG. 16 is a plan view illustrating the configuration of a piezoelectric transducer according to a third modification of the present preferred embodiment of the present invention. As illustrated in FIG. 16, in a piezoelectric transducer 100c according to the third modification of the present preferred embodiment of the present invention, a plurality of beam portions 110c extend in the same or substantially the same plane.

Each of the plurality of beam portions 110c has a trapezoidal outer shape with a fixed end portion 111c as the lower base when viewed from the direction perpendicular or substantially perpendicular to this plane. Accordingly, a rectangular or substantially rectangular gap is provided in the central portion of the piezoelectric transducer 100c so as to be surrounded by respective tip end portions 112c of the plurality of beam portions 110c.

In the piezoelectric transducer 100c according to the third modification of the present preferred embodiment, the axial direction of the orthogonal axis X' intersects with the extending direction E of each of the plurality of beam portions 110c.

Figure 17:
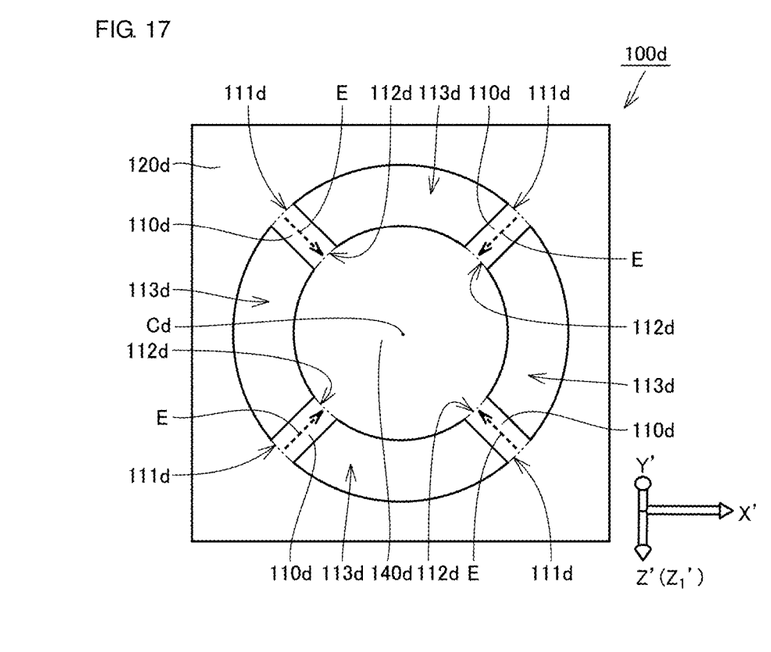
FIG. 17 is a plan view illustrating the configuration of a piezoelectric transducer according to a fourth modification of a preferred embodiment of the present invention.

FIG. 17 is a plan view illustrating the configuration of a piezoelectric transducer according to a fourth modification of the present preferred embodiment of the present invention. As illustrated in FIG. 17, a piezoelectric transducer 100d according to the fourth modification of the present preferred embodiment of the present invention includes a plurality of beam portions 110d and a base portion 120d, and further includes a plate-shaped portion 140d.

The plurality of beam portions 110d extend in the same or substantially the same plane. Each of the plurality of beam portions 110d has a rectangular or substantially rectangular outer shape when viewed from the direction perpendicular or substantially perpendicular to this plane.

A tip end portion 112d of each of the plurality of beam portions 110d is connected to the plate-shaped portion 140d. The plate-shaped portion 140d has a circular or substantially circular outer shape with a virtual center point Cd of the piezoelectric transducer 100d as the center when viewed from the direction perpendicular to the above-described plane.

The plate-shaped portion 140d is not connected to and is spaced apart from the base portion 120d. Accordingly, during driving of the piezoelectric transducer 100d, by displacement of each of the plurality of beam portions 110d in the up-down direction, the plate-shaped portion 140d moves in the up-down direction.

When viewed from the direction perpendicular or substantially perpendicular to the above-described plane, an edge portion on the base portion 120d side of a gap 113d between the beam portions 110d which are adjacent while extending in directions different from each other in the above-described plane has an arc shape of the circle with the virtual center point Cd as the center.

In the piezoelectric transducer 100d according to the fourth modification of the present preferred embodiment, the axial direction of the orthogonal axis X' intersects with the extending direction E of each of the plurality of beam portions 110d. With this configuration, in the present modification, the difference in stresses in the respective extending directions E among the plurality of beam portions 110d can be reduced. For this reason, with respect to stresses respectively applied to a plurality of connection portions that respectively connect the plurality of beam portions 110d and the plate-shaped portion 140d to each other, a stress difference among the connection portions can be reduced. Accordingly, the reliability of the piezoelectric transducer 100d can be improved.

Figure 18:
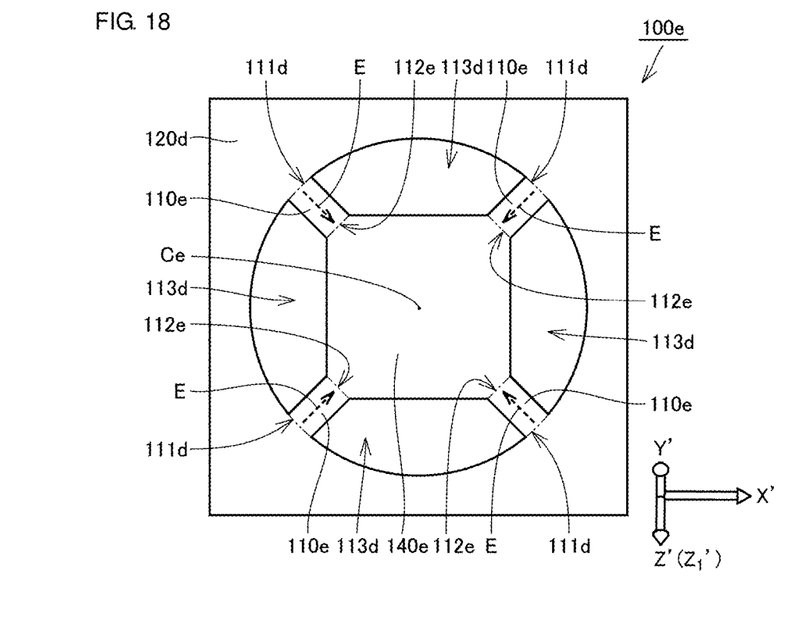
FIG. 18 is a plan view illustrating the configuration of a piezoelectric transducer according to a fifth modification of a preferred embodiment of the present invention.

FIG. 18 is a plan view illustrating the configuration of a piezoelectric transducer according to a fifth modification of the present preferred embodiment of the present invention. As illustrated in FIG. 18, a piezoelectric transducer 100e according to the fifth modification of the present preferred embodiment of the present invention is different from the piezoelectric transducer 100d according to the fourth modification of the present preferred embodiment only in a shape of the plate-shaped portion.

In the piezoelectric transducer 100e according to the fifth modification of the present preferred embodiment, a plurality of beam portions 110e extend in the same or substantially the same plane. When viewed from the direction perpendicular or substantially perpendicular to this plane, a plate-shaped portion 140e has a square or substantially square outer shape with a virtual center point Ce of the piezoelectric transducer 100e as the center.

Respective tip end portions 112e of the plurality of beam portions 110e are connected to the plate-shaped portion 140e at vertexes of the square or substantially square shape of the plate-shaped portion 140e, respectively.

In the piezoelectric transducer 100e according to the fifth modification of the present preferred embodiment, the axial direction of the orthogonal axis X' intersects with the extending direction E of each of the plurality of beam portions 110e.

Figure 19:
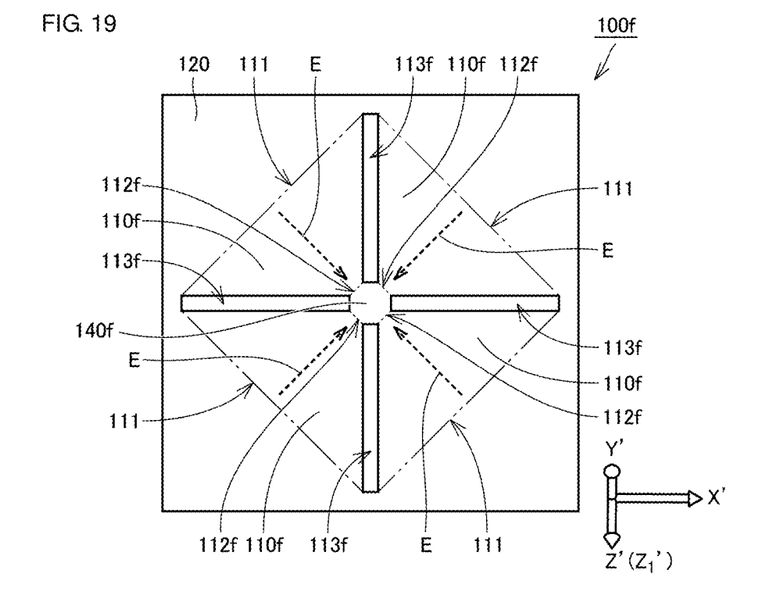
FIG. 19 is a plan view illustrating the configuration of a piezoelectric transducer according to a sixth modification of a preferred embodiment of the present invention.

FIG. 19 is a plan view illustrating the configuration of a piezoelectric transducer according to a sixth modification of the present preferred embodiment of the present invention. As illustrated in FIG. 19, a piezoelectric transducer 100f according to the sixth modification of the present preferred embodiment of the present invention is different from the piezoelectric transducer 100d according to the fourth modification of the present preferred embodiment in an outer shape of each of the plurality of beam portions and an outer shape of the plate-shaped portion.

In the piezoelectric transducer 100f according to the sixth modification of the present preferred embodiment, a plurality of beam portions 110f extend in the same or substantially the same plane. Each of the plurality of beam portions 110f has an outer shape that is tapered in the extending direction E when viewed from the direction perpendicular or substantially perpendicular to this plane. Specifically, each of the plurality of beam portions 110f has a trapezoidal outer shape when viewed from the direction perpendicular or substantially perpendicular to the above-described plane. In a direction in which a gap 113f extends, the width of the gap 113 f is constant or substantially constant. A plate-shaped portion 140f has a polygonal outer shape when viewed from the direction perpendicular or substantially perpendicular to the above-described plane. Specifically, the plate-shaped portion 140f has an octagonal outer shape when viewed from the direction perpendicular or substantially perpendicular to the above-described plane.

Respective tip end portions 112f of the plurality of beam portions 110f are connected to the plate-shaped portion 140f at sides of the polygonal shape of the plate-shaped portion 140f, respectively.

In the piezoelectric transducer 100f according to the sixth modification of the present preferred embodiment, the axial direction of the orthogonal axis X' intersects with the extending direction E of each of the plurality of beam portions 110f.

Figure 20:
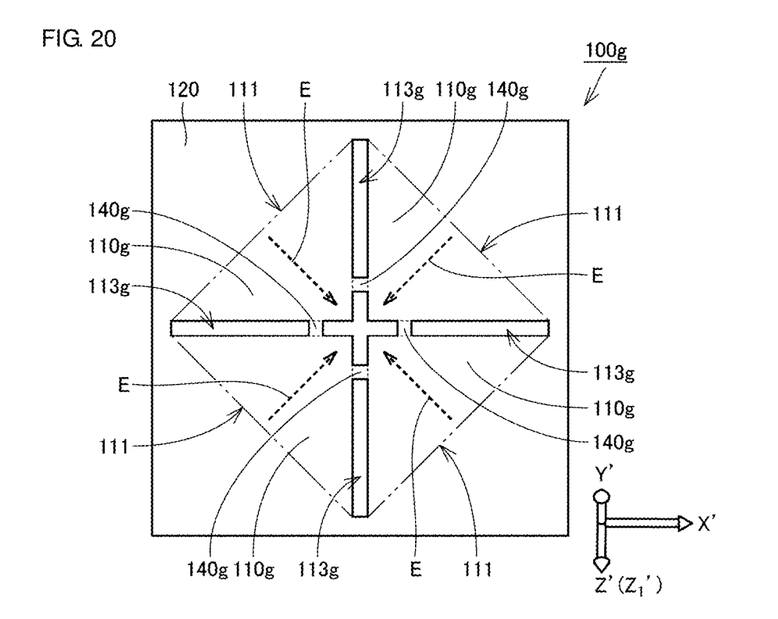
FIG. 20 is a plan view illustrating the configuration of a piezoelectric transducer according to a seventh modification of a preferred embodiment of the present invention.

FIG. 20 is a plan view illustrating the configuration of a piezoelectric transducer according to a seventh modification of the present preferred embodiment of the present invention. As illustrated in FIG. 20, a piezoelectric transducer 100g according to the seventh modification of the present preferred embodiment of the present invention is different from the piezoelectric transducer 100f according to the sixth modification of the present preferred embodiment mainly in that a plurality of plate-shaped portions is provided.

In the piezoelectric transducer 100g according to the seventh modification of the present preferred embodiment, a plurality of beam portions 110g extend in the same or substantially the same plane. Each of the plurality of beam portions 110g has a triangular outer shape when viewed from the direction perpendicular or substantially perpendicular to the above-described plane.

The piezoelectric transducer 100g according to the seventh modification of the present preferred embodiment includes a plurality of plate-shaped portions 140g. The plurality of plate-shaped portions 140g are respectively located for the plurality of gaps 113g in one-to-one correspondence, and each connects two beam portions 110g to each other which are adjacent to each other. Each of the plurality of plate-shaped portions 140g has a rectangular outer shape when viewed from the direction perpendicular or substantially perpendicular to the above-described plane.

In the piezoelectric transducer 100g according to the seventh modification of the present preferred embodiment, the axial direction of the orthogonal axis X' intersects with the extending direction E of each of the plurality of beam portions 110g.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A piezoelectric transducer comprising:
a plurality of beam portions each including a fixed end portion and extending in a direction away from the fixed end portion; and
a base portion connected to the fixed end portion of each of the plurality of beam portions; wherein
each of the plurality of beam portions extends in a same or substantially a same plane, and respective extending directions of at least two beam portions of the plurality of beam portions are different from each other;
the plurality of beam portions each include a single crystal piezoelectric layer having a polarization axis in a same or substantially a same direction, an upper electrode layer on an upper side of the single crystal piezoelectric layer, and a lower electrode layer facing at least a portion of the upper electrode layer with the single crystal piezoelectric layer interposed therebetween;
the polarization axis has a polarization component in the plane; and
an axial direction of an orthogonal axis that is orthogonal or substantially orthogonal to the polarization axis and extends in the plane intersects with an extending direction of each of the plurality of beam portions.

2. The piezoelectric transducer according to claim 1, wherein an angle between the extending direction of each of the plurality of beam portions and the axial direction of the orthogonal axis is equal to or greater than about 40 degrees and equal to or smaller than about 50 degrees.

3. The piezoelectric transducer according to claim 1, wherein the single crystal piezoelectric layer is made of lithium niobate or lithium tantalate.

4. The piezoelectric transducer according to claim 3, wherein the polarization axis extends only in the plane.

5. The piezoelectric transducer according to claim 1, wherein
the plurality of beam portions include at least three beam portions; and
when viewed from a direction perpendicular or substantially perpendicular to the plane, each of the plurality of beam portions has a triangular or quadrilateral outer shape and spaces between beam portions which are adjacent while extending in different directions from each other in the plane are equal or substantially equal to each other.

6. The piezoelectric transducer according to claim 1, wherein each of the plurality of beam portions is mutually point-symmetrically arranged with respect to a virtual center point of the piezoelectric transducer when viewed from the direction perpendicular or substantially perpendicular to the plane.

7. The piezoelectric transducer according to claim 1, wherein
the plurality of beam portions includes four beam portions; and
the respective extending directions of adjacent beam portions of the four beam portion are different from each other by about 90°.

8. The piezoelectric transducer according to claim 1, wherein each of the plurality of beam portions is spaced apart from one another with a gap interposed therebetween.

9. The piezoelectric transducer according to claim 1, wherein each of the plurality of beam portions includes a tip end portion spaced away from the base portion.

10. The piezoelectric transducer according to claim 1, wherein the single crystal piezoelectric layer includes a hole extending therethrough and being located above the lower electrode layer.

11. The piezoelectric transducer according to claim 1, wherein the upper and lower electrode layers are made of Pt.

12. The piezoelectric transducer according to claim 1, further comprising:
a substrate below the lower electrode layer; wherein
the substrate includes a handle layer, a BOX layer laminated on an upper portion of the handle layer, and an active layer laminated on an upper portion of the BOX layer.

13. The piezoelectric transducer according to claim 12, wherein the handle layer and the active layer are made of Si.

14. The piezoelectric transducer according to claim 12, wherein the BOX layer is made of $SiO_2$.

15. The piezoelectric transducer according to claim 12, further comprising an intermediate layer between the substrate and the lower electrode layer.

16. The piezoelectric transducer according to claim 15, wherein the intermediate layer is made of $SiO_2$.

17. The piezoelectric transducer according to claim 1, wherein each of the plurality of beam portions has a trapezoidal outer shape when viewed from the direction perpendicular or substantially perpendicular to the plane.

18. The piezoelectric transducer according to claim 1, wherein each of the plurality of beam portions has an outer shape with a constant or substantially constant width in the extending direction.

* * * * *